United States Patent [19]

Takishima et al.

[11] Patent Number: 5,488,616

[45] Date of Patent: Jan. 30, 1996

[54] SYSTEM FOR PROVIDING REVERSIBLE VARIABLE LENGTH CODES

[75] Inventors: Yasuhiro Takishima; Masahiro Wada; Hitomi Murakami, all of Saitama, Japan

[73] Assignee: Kokusai Denshin Denwa Co., Ltd., Tokyo, Japan

[21] Appl. No.: 44,472

[22] Filed: Apr. 9, 1993

[30] Foreign Application Priority Data

Apr. 17, 1992 [JP] Japan ................................. 4-122822

[51] Int. Cl.$^6$ ............................. H03M 7/40; H03M 13/00
[52] U.S. Cl. ................................................ 371/30; 341/82
[58] Field of Search ............................. 371/30; 341/79, 341/94, 67, 107, 82

[56] References Cited

PUBLICATIONS

"A Method for the Construction of Minimum–Redundancy Codes", Huffman, Proceedings of the I.R.E., vol. 40, Sep. 1952, pp. 1098–1101.
"Coding of Digital TV Signal; Variable Length Codes Applied to DCT Coefficients", Barbero et al, Digital TV Signal Coding 1989, pp. 1–13.

Primary Examiner—Stephen M. Baker
Attorney, Agent, or Firm—Nikaido Marmelstein Murray & Oram

[57] ABSTRACT

A variable length code system which is instantaneously decodable in both forward direction and backward direction is generated either in asymmetrical form or symmetrical form. The code thus generated has high transmission efficiency, and capable of backward reconstruction of video signals even when some bits are lost during transmission. The symbols to be encoded are prepared (1) with occurrence probability, and they are provisionally encoded to a non-reversible variable length code (2). Then, the provisional code is transformed to an asymmetrical reversible code (4) through equivalent transform process (9), reverse symbol tree process (10), and bit supplement process (12) when suffix condition is not satisfied. The provisional code is also transformed to a symmetrical reversible code (3) by assigning a symmetrical code word to each symbol on a symbol tree (FIG. 5). At least one of symmetrical code or a asymmetrical code is selected (5), and is provided as a final resultant code.

5 Claims, 4 Drawing Sheets

Fig. 4
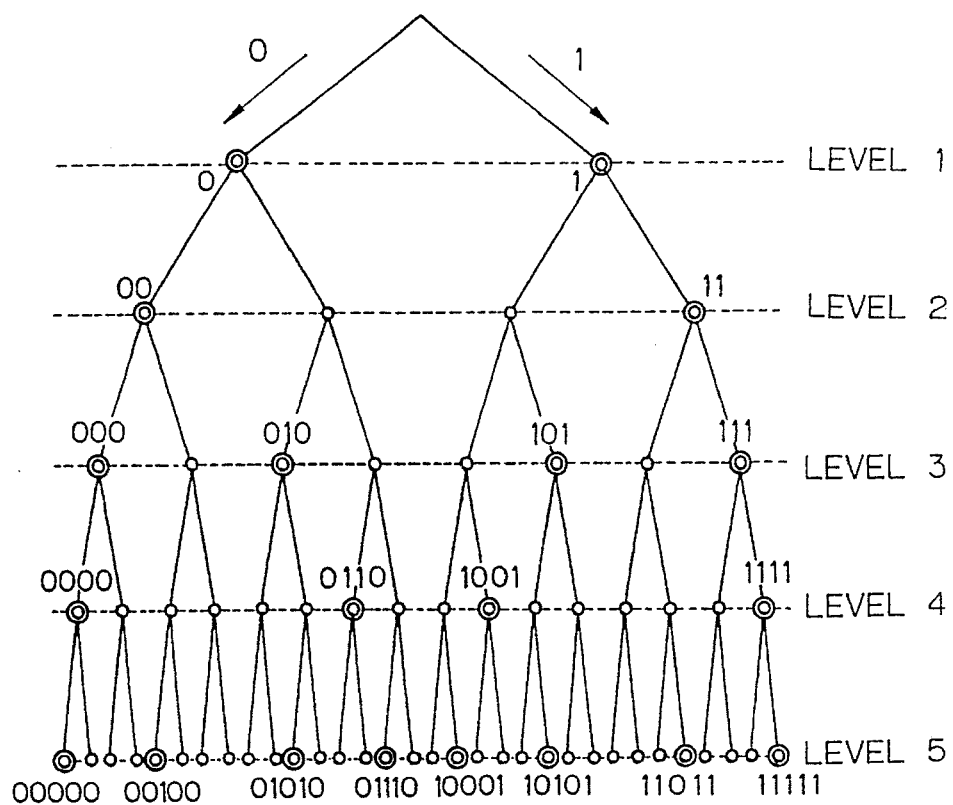
⊚ : SYMMETRICAL CODE WORD
○ : ASYMMETRICAL CODE WORD
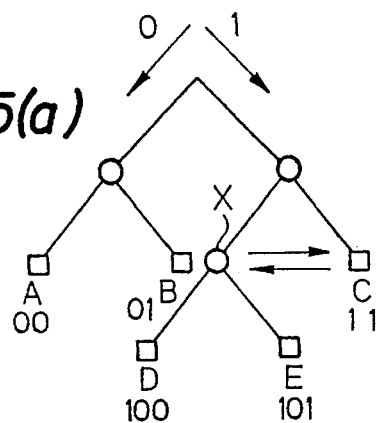
Fig.5(a)
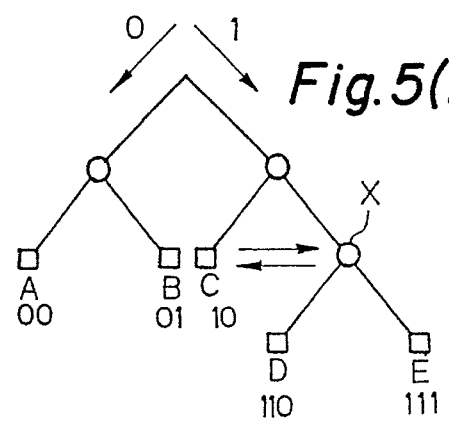
Fig.5(b)
A : SUFFIX OF D
B : SUFFIX OF E
C : SUFFIX OF D

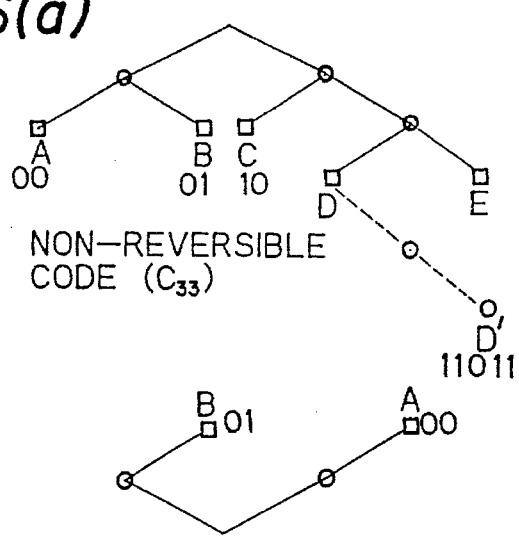
Fig.6(a)
NON-REVERSIBLE CODE ($C_{33}$)
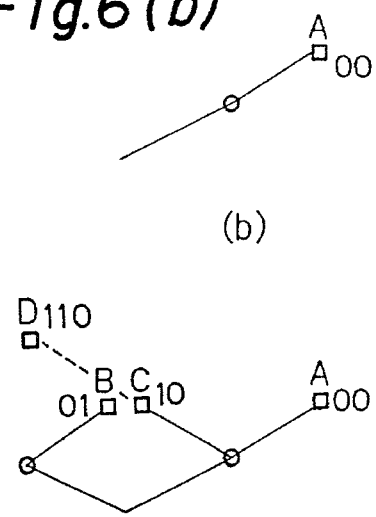
Fig.6(b)
(b)
Fig.6(c)
Fig.6(d)
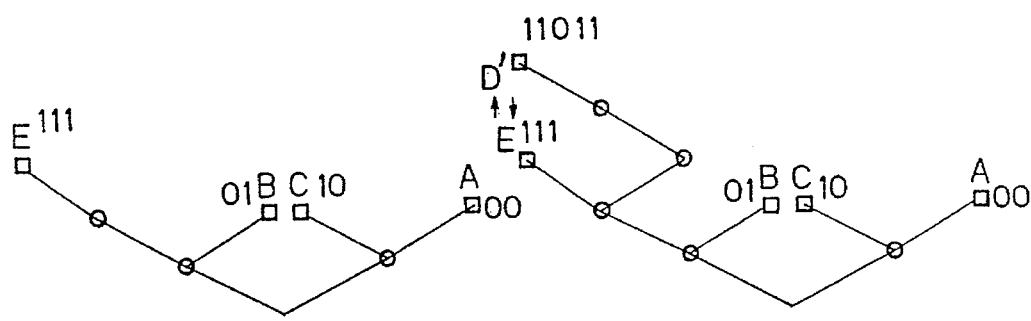
Fig.6(e)
Fig.6(f)
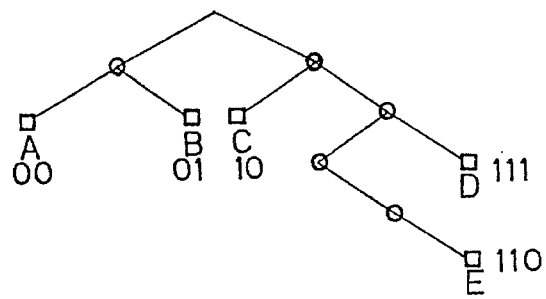
Fig.6(g)
(g) REVERSIBLE CODE ($C_{34}$)

SYSTEM FOR PROVIDING REVERSIBLE VARIABLE LENGTH CODES

BACKGROUND OF THE INVENTION

The present invention relates to a system for providing reversible variable length codes. The present invention is used for a digital communication system which transmits information through encoding to 1 and/or 0. The present invention is used in particular in picture transmission, voice transmission, and/or data transmission field.

A variable length code is defined as a code which has variable length for each symbol. When a shorter code is assigned to symbol which appears often than a symbol which appears with small probability, the total code length for a full text is shortened as compared with that of the case when a fixed length code is used, and therefore, the transmission efficiency is improved.

A reversible code is defined as a code which is decoded not only in forward direction of a code, but also in backward direction of a code. A reversible code is advantageous when some bit error happens. Because of a bit error, even when a decoding in forward direction is impossible, a decoding in backward direction might be possible. The backward decoding is advantageous in particular for reconstruction of video signals in backward direction when some bits are lost in transmission.

A reversible code must satisfy two conditions, a prefix condition, and a suffix condition, in order to make the instantaneous decoding, which is defined that an end or start of a symbol is recognized just when each bit is received. The prefix condition is defined that any code is not included in a former part or prefix portion of a longer code, and the suffix condition is defined that any code is not included in a rear part or suffix portion of a longer code.

Conventionally, a fixed length code and a B2 code have been known as a reversible code which satisfies also said prefix condition and said suffix condition. A B2 code is described in "Coding of digital TV signal; Variable length codes applied to DCT coefficients" by M. Barbero et al, in Digital TV Signal Coding 1989.

A fixed length code has the feature that an automatic synchronization between symbols is established in both forward direction and in backward direction since each symbol has the same bit length as each other.

A B2 code is constituted by combination of two bits of a continuous flag bit and an information bit. The continuous flag bit is, for instance, 0 for terminated bit, and 1 for continued bit. As a continuous flag bit indicates termination of a symbol, an instantaneous decoding in both forward direction and backward direction is possible.

Examples of the fixed length code and the B2 code are shown in the tables 1 and 2, where table 1 shows codes for alphabetic symbols (S1), and table 2 shows codes for interframe motion vector symbols (S2) in image encoding. The value $P_1$ shows occurrence probability of each alphabetical symbols, the value $P_2$ shows occurrence probability of each vector symbols, $C_{12}$ and $C_{22}$ are fixed length codes for $P_1$ and $P_2$, respectively, and $C_{13}$ and $C_{23}$ are B2 codes for $P_1$ and $P_2$, respectively.

The conventional variable length codes $C_{11}$ and $C_{21}$ are shown in the tables 1 and 2 (Huffman code) for interest. Those codes are decodable only in forward direction.

In the tables 1 and 2, a fixed length code has the disadvantage that an average code length is long, and therefore, the transmission efficiency of information is low.

A B2 code has the disadvantage that it must have a pair of decoding tables for forward direction decoding and backward direction decoding, respectively, as a code itself is asymmetrical.

A non-reversible variable length code has the disadvantage that it can not be decoded in backward direction although the average code length is short.

TABLE 1

| ($S_1$) | Occurrence probability ($P_1$) | Huffman ($C_{11}$) L Code | Fixed ($C_{12}$) L Code | B2 ($C_{13}$) L Code | Symmetrical reversible ($C_{14}$) L Code | Asymmetrical reversible ($C_{15}$) L Code |
|---|---|---|---|---|---|---|
| E | 0.14878570 | 3 001 | 5 00001 | 2 00 | 3 000 | 3 001 |
| T | 0.09354149 | 3 110 | 5 00010 | 2 01 | 3 111 | 3 110 |
| A | 0.08833733 | 4 0000 | 5 00011 | 4 1000 | 4 0110 | 4 0000 |
| O | 0.07245796 | 4 0100 | 5 00100 | 4 1001 | 4 1001 | 4 0100 |
| R | 0.06872164 | 4 0101 | 5 00101 | 4 1100 | 5 00100 | 4 1000 |
| N | 0.06498532 | 4 0110 | 5 00110 | 4 1101 | 5 11011 | 4 1010 |
| H | 0.05831331 | 4 1000 | 5 00111 | 6 101000 | 5 01010 | 4 0101 |
| I | 0.05644515 | 4 1001 | 5 01000 | 6 101001 | 5 10101 | 5 11100 |
| S | 0.05537763 | 4 1010 | 5 01001 | 6 101100 | 5 01110 | 5 01100 |
| D | 0.04376834 | 5 00010 | 5 01010 | 6 101101 | 5 10001 | 5 00010 |
| L | 0.04123298 | 5 00011 | 5 01011 | 6 111000 | 6 001100 | 5 10010 |
| U | 0.02762209 | 5 10110 | 5 01100 | 6 111001 | 6 110011 | 5 01111 |
| P | 0.02575393 | 5 10111 | 5 01101 | 6 111100 | 6 010010 | 5 10111 |
| F | 0.02455297 | 5 11100 | 5 01110 | 6 111101 | 6 101101 | 5 11111 |
| M | 0.02361889 | 5 11110 | 5 01111 | 8 10101000 | 6 011110 | 6 111101 |
| C | 0.02081665 | 5 11111 | 5 10000 | 8 10101001 | 6 100001 | 6 101101 |
| W | 0.01868161 | 6 011100 | 5 10001 | 8 10101100 | 7 0010100 | 6 000111 |
| G | 0.01521216 | 6 011101 | 5 10010 | 8 10101101 | 7 1101011 | 6 011101 |
| Y | 0.01521216 | 6 011110 | 5 10011 | 8 10111000 | 7 0011100 | 6 100111 |
| B | 0.01267680 | 6 011111 | 5 10100 | 8 10111001 | 7 1100011 | 7 1001101 |
| V | 0.01160928 | 6 111011 | 5 10101 | 8 10111100 | 7 0100010 | 8 01110011 |
| K | 0.00867360 | 7 1110100 | 5 10110 | 8 10111101 | 7 1011101 | 8 00011011 |
| X | 0.00146784 | 8 11101011 | 5 10111 | 8 11101000 | 8 00111100 | 9 000110011 |
| J | 0.00080064 | 9 111010101 | 5 11000 | 8 11101001 | 9 001010100 | 10 001101011 |
| Q | 0.00080064 | 10 1110101000 | 5 11001 | 8 11101100 | 10 0010110100 | 11 00011010011 |

TABLE 1-continued

| Occurrence probability | Huffman ($C_{11}$) | Fixed ($C_{12}$) | B2 ($C_{13}$) | Symmetrical reversible ($C_{14}$) | Asymmetrical reversible ($C_{15}$) |
|---|---|---|---|---|---|
| ($S_1$) ($P_1$) | L Code | L Code | L Code | L Code | L Code |
| Z 0.00053376 | 10 1110101001 | 5 11010 | 8 11101101 | 10 1101001011 | 12 000110100011 |
| Average length | 4.15572453 | 5.00000000 | 4.70189428 | 4.69655657 | 4.36068869 |
| | Prior Art | | | Invention | |

TABLE 2

| Occurrence probability | Huffman ($C_{21}$) | Fixed ($C_{22}$) | B2 ($C_{23}$) | Symmetrical reversible ($C_{24}$) | Asymmetrical reversible ($C_{25}$) |
|---|---|---|---|---|---|
| ($S_2$) ($P_2$) | L Code | L Code | L Code | L Code | L Code |
| MV1 0.40111506 | 1 1 | 6 000001 | 2 00 | 1 0 | 1 1 |
| MV2 0.12033451 | 3 010 | 6 000010 | 2 01 | 3 111 | 3 010 |
| MV3 0.10830107 | 3 011 | 6 000011 | 4 1000 | 3 101 | 3 000 |
| MV4 0.10428991 | 4 0010 | 6 000100 | 4 1001 | 4 1001 | 4 0110 |
| MV5 0.09987765 | 4 0011 | 6 000101 | 4 1100 | 5 11011 | 5 00100 |
| MV6 0.03744409 | 5 00010 | 6 000110 | 4 1101 | 5 10001 | 5 01110 |
| MV7 0.03208920 | 5 00011 | 6 000111 | 6 101000 | 6 110011 | 6 001100 |
| MV8 0.01403903 | 7 0000110 | 6 001000 | 6 101001 | 7 1101011 | 7 0011110 |
| MV9 0.01383847 | 7 0000111 | 6 001001 | 6 101100 | 7 1100011 | 7 0111100 |
| MV10 0.00762119 | 7 0000000 | 6 001010 | 6 101101 | 7 1000001 | 7 0011100 |
| MV11 0.00734041 | 8 00001010 | 6 001011 | 6 111000 | 8 11000011 | 8 00111110 |
| MV12 0.00730029 | 8 00001011 | 6 001100 | 6 111001 | 8 10000001 | 8 01111110 |
| MV13 0.00722007 | 8 00001000 | 6 001101 | 6 111100 | 9 110101011 | 8 01111100 |
| MV14 0.00701951 | 8 00001001 | 6 001110 | 6 111101 | 9 110011011 | 9 001110100 |
| MV15 0.00681896 | 8 00000110 | 6 001111 | 8 10101000 | 9 110000011 | 9 001110100 |
| MV16 0.00661840 | 8 00000111 | 6 010000 | 8 10101001 | 9 100000001 | 9 011111110 |
| MV17 0.00413149 | 8 00000010 | 6 010001 | 8 10101100 | 10 1101001011 | 10 0011111100 |
| MV18 0.00162452 | 10 0000010110 | 6 010010 | 8 10101101 | 10 1100000011 | 10 0111110100 |
| MV19 0.00160847 | 10 0000010111 | 6 010011 | 8 10111000 | 10 1000000001 | 10 0011101100 |
| MV20 0.00135176 | 10 0000010100 | 6 010100 | 8 10111001 | 11 11010101011 | 10 0111101100 |
| MV21 0.00134374 | 10 0000010101 | 6 010101 | 8 10111100 | 11 11010001011 | 11 01111101100 |
| MV22 0.00132368 | 10 0000010010 | 6 010110 | 8 10111101 | 11 11001010011 | 11 01111011100 |
| MV23 0.00128357 | 10 0000010011 | 6 010111 | 8 11101000 | 11 11000100011 | 11 00111011100 |
| MV24 0.00058162 | 11 00000100010 | 6 011000 | 8 11101001 | 11 11000000011 | 11 01111011110 |
| MV25 0.00057359 | 11 00000100011 | 6 011001 | 8 11101100 | 11 10000100001 | 11 00111011110 |
| MV26 0.00056958 | 11 00000100000 | 6 011010 | 8 11101101 | 11 10000000001 | 12 001110110100 |
| MV27 0.00056156 | 11 00000100001 | 6 011011 | 8 11111000 | 12 110100001011 | 12 011111011100 |
| MV28 0.00054151 | 11 00000011110 | 6 011100 | 8 11111001 | 12 110010010011 | 12 011110110100 |
| MV29 0.00052145 | 11 00000011111 | 6 011101 | 8 11111100 | 12 110000000011 | 12 011111010100 |
| MV30 0.00050139 | 11 00000011100 | 6 011110 | 8 11111101 | 12 100001100001 | 12 011111011110 |
| MV31 0.00048134 | 11 00000011101 | 6 011111 | 10 1010101000 | 12 100000000001 | 12 001110111110 |
| MV32 0.00046128 | 11 00000011010 | 6 100000 | 10 1010101001 | 13 1101010101011 | 12 011110111110 |
| MV33 0.00044123 | 11 00000011011 | 6 100001 | 10 1010101100 | 13 1101001001011 | 13 0111101101100 |
| MV34 0.00042919 | 11 00000011001 | 6 100010 | 10 1010101101 | 13 1101000001011 | 13 0111110101100 |
| MV35 0.00040112 | 11 00000011000 | 6 100011 | 10 1010111000 | 13 1100101010011 | 13 0011101101100 |
| Average length | 3.02351332 | 6.000000 | 3.28314328 | 3.20279551 | 3.19433165 |
| | Prior Art | | | Invention | |

SUMMARY OF THE INVENTION

It is an object, therefore, of the present invention to overcome the disadvantages and limitations of a prior code system by providing a new and improved code system.

It is also an object of the present invention to provide a reversible variable length codes which have high transmission efficiency, and are capable to decoding in both forward direction, and backward direction.

The above and other objects are attained by a reversible instantaneously decodable variable length code generation system comprising; means for providing symbols with occurrence probability of each symbol; first encoding means for provisionally encoding said symbols to non-reversible variable length code according to occurrence probability of each symbol; second encoding means for transforming said non-reversible code to asymmetrical reversible code; third encoding means for transforming said non-reversible code to symmetrical reversible code; and selection means for selecting at least one output of said second encoding means and said third encoding means to provide an instantaneously decodable reversible variable length code.

Said second encoding means is comprised of; equivalent transform means for exchanging leaves or nodes on a symbol tree on the same level as each other so that number of infringement of suffix condition is reduced; reverse tree generator means coupled with output of said equivalent transform means to assign each symbol on a reverse symbol tree; a suffix test means coupled with said reverse the generator means to test if a symbol assigned in said reverse tree generator means satisfies a suffix condition; a bit supplement means for supplement at least one bit at end of a code assigned in said reverse tree generator means when said suffix condition is infringed; sorting means coupled with output of said suffix test means to sort the thus generated codes so that a short code is assigned to a symbol of higher occurrence probability, to provide a resultant asymmetrical variable length code.

Said third encoding means is comprised of; a bit length vector test means for providing number of symbols to be assigned for each bit length; a code word assigner for assigning a symmetrical code to each symbol on each level of a symbol tree, when available number of symmetrical code spaces satisfying prefix condition on the level of the symbol tree is larger than number of symbols to be assigned having bit length equal to said level; a bit length vector modification means for incrementing bit length of a symbol when said available number of symmetrical code spaces is less than number of symbols to be assigned on the level of the bit length, supplied by said bit length vector test means; and means for repeating above steps after updating the bit length vector in said bit length vector test means.

BRIEF DESCRIPTION OF THE DRAWINGS

The foregoing and other objects, features, and attendant advantages of the present invention will be appreciated as the same become better understood by means of the following description and accompanying drawings wherein;

FIG. 4 is an explanatory drawing of the operation of FIG. 2, FIGS. 5(a) and (b) show equivalent transform of codes for explanation of the operation of FIG. 3, FIGS. 6(a)–(g) show reverse tree for explanation of the operation of FIG. 3.

DESCRIPTION OF THE PREFERRED EMBODIMENTS

Figure 1:
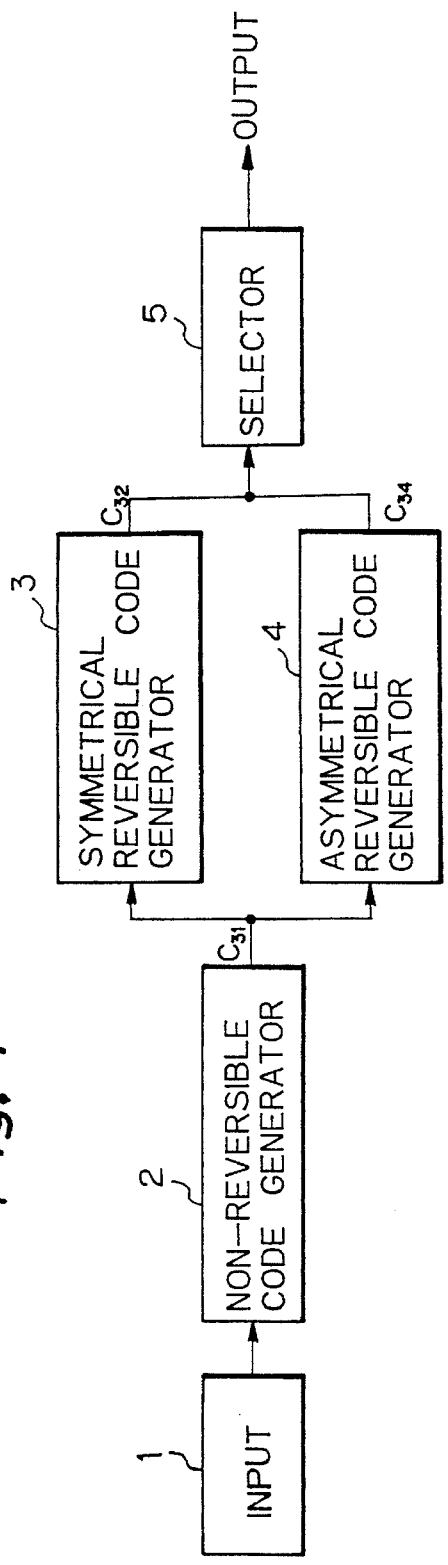
FIG. 1 is a block diagram of a code generation system according to the present invention.

FIG. 1 shows a block diagram of the reversible variable length code generation system according to the present invention. In the figure, the numeral 1 shows an input portion of symbols together with occurrence probability of each symbols, 2 is a non-reversible code generator, which provides an instantaneously decodable code in forward direction with short average length, 3 is a symmetrical reversible variable length code generator, 4 is an asymmetrical reversible variable length code generator, and 5 is a selector which selects one or both of the outputs of the generators 3 and 4 to provide a generated reversible variable length code according to the present invention.

The non-reversible code generator 2 is conventional, and is described for instance in "A Method for the construction of minimum redundancy codes" by D. Huffman in Proc. Inst. radio eng., vol 40, pages 1098–1101, Sep. 1952.

The following description has the embodiment of table 3, in which five symbols A, B, C, D and E each having the occurrence probability $P_3$ are considered.

TABLE 3

| Symbol $S_3$ | occurrence probability $P_3$ | $C_{31}$ (2) | $C_{32}$ (3) | $C_{33}$ Provisional | $C_{34}$ (4) |
|---|---|---|---|---|---|
| A | 0.33 | 00 | 00 | 00 | 00 |
| B | 0.30 | 01 | 11 | 01 | 01 |
| C | 0.18 | 11 | 010 | 10 | 10 |
| D | 0.10 | 100 | 101 | 110 | 111 |
| E | 0.09 | 101 | 0110 | 111 | 11011 |
| Average code length | | 2.19 | 2.46 | (2.19) | 2.37 |

In the table 3, the code $C_{31}$ is conventional non-reversible variable length code supplied at the output of the non-reversible code generator 2.

The code $C_{32}$ is symmetrical variable length code supplied at the output of the symmetrical reversible variable length code generator 3.

The code $C_{33}$ is provisional non-reversible variable length code for generating the asymmetrical variable length code $C_{34}$ supplied at the output of the asymmetrical reversible variable length code generator 4.

In FIG. 1, the symbols together with the occurrence probability of each symbols are applied to the symbol input 1, which supplies those symbols and the occurrence probability to the non-reversible code generator 2. The non-reversible code generator 2 is conventional, and generates the code $C_{31}$ together with the code length vector $BLV_3$ based upon occurrence probability of each symbol. The code $C_{31}$ is decodable only in forward direction, but not in backward direction. The bit length vector $BLV_3$ in the table 3 is;

$$BLV_3 = (0, 3, 2)$$

Each element (0, 3, 2) in the bit length vector shows the number of symbols having the code length 1, 2 (A, B and C) and 3 (D and E), respectively, in the code $C_{31}$.

The symbols $S_3$, the occurrence probability $P_3$, the non-reversible code $C_{31}$, and the bit length vector $BLV_3$ are applied to the symmetrical reversible code generator 3 and the asymmetrical reversible code generator 4, which generate the symmetrical code $C_{32}$ and the asymmetrical code $C_{34}$, respectively. The selector 5 selects one or both of the codes $C_{32}$ and $C_{34}$ to provide the final generated code.

Figure 2:
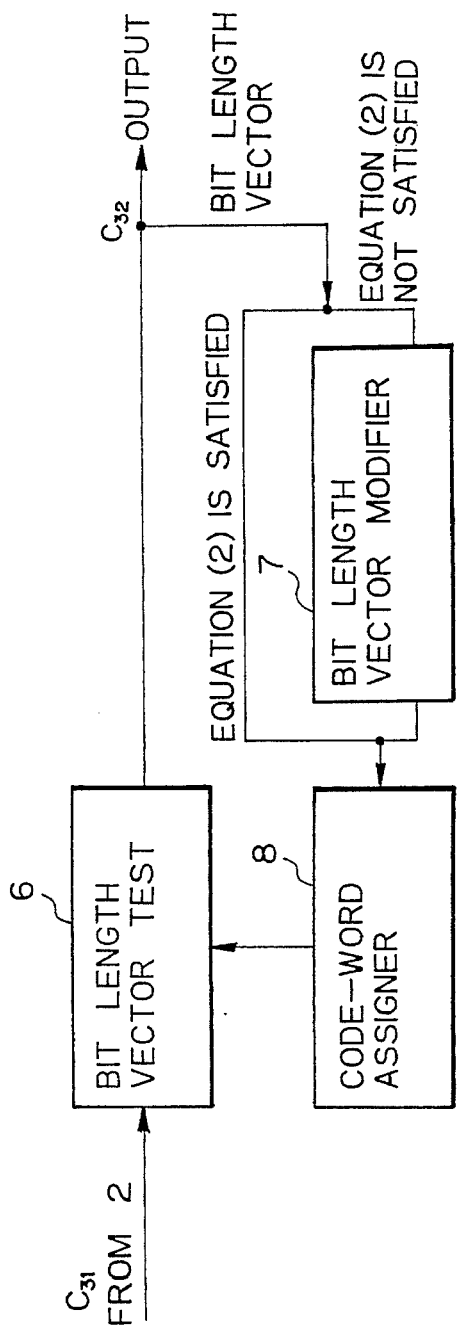
FIG. 2 is a block diagram of a symmetrical reversible code generator 3 in FIG. 1.

FIG. 2 shows a block diagram of the symmetrical reversible variable length code generator 2. In FIG. 2, the numeral 6 is a bit length vector test, 7 is a bit length vector modifier for modifying a bit length vector, and 8 is a code-word assigner for assigning a symmetrical code to each symbol.

The symmetrical variable code generator 3 in FIG. 2 for providing the symmetrical reversible code $C_{32}$ operates as follows. First, the bit length vector test 6 initiates the elements $n_{rev}(i)$ of the bit length vector $BLV_3$ with that of the non-reversible code.

$$n_{rev}(i) = n(i) \qquad (1)$$

where n(i) is number of symbols having the length i in the non-reversible codes.

$n_{rev}(i)$ is number of symbols having the length i in the reversible codes.

Next, each element $n_{rev}(i)$ of the bit length vector is tested if it satisfies the following condition, starting from i=1, which is incremented one by one.

For a code having the bit length (i);

$$n_{rev}(i) \leqq m(i) \qquad (2)$$

where;

m(i)=available spaces of symmetrical code words having the length (i) on a symbol tree $$m(i) = m_0(i) - \sum_{j=1}^{[i/2]} 2^{[(i-2j+1)/2]} \times n_{rev}(j) \quad (3)$$

$$m_0(i) = 2^{[(i+1)/2]} \quad (4)$$

= number of symmetrical code words having the length (i) on a symbol tree

[u]=maximum interger which does not exceed u $$x(i) = \sum_{j=[i/2]+1}^{i-1} y(i, j) \quad (5)$$

y(i, j) is number of codes of length j, having the symmetrical suffix of 2j-1 bits from the end.

When the equation (2) is satisfied, the symmetrical code assigner 8 assigns a symmetrical code to each symbol of bit length i, so that prefix condition is satisfied.

On the other hand, when the equation (2) is not satisfied, the Code-word assigner 8 assigns m(i) number of symbols among $n_{rev}$ (i) symbols on the level (i).

After the assignment of symbols on the available spaces on the level (i), the bit length of unassigned symbols is incremented by one, and the bit length vector modifier 7 updates the bit length vector on the level (i+1) by adding the number of unassigned symbols ($n_{rev}(i)-m(i)$) on the level (i) as follows.

$$n_{rev}(i+1)=n_{rev}(i+1)+(n_{rev}(i)-m(i)) \quad (6)$$

The above process is easily understood with the numerical embodiment by using a symbol tree of FIG. 4. In the example of the provisional code $C_{31}$ in the table 3, n(1)=0, n(2)=3 n(3)=2 n(4)=0 and n(5)=0 are satisfied. Therefore, by applying the equation (1), the initial value of $n_{rev}(i)$ is as follows.

$n_{rev}$ (1)=0 $n_{rev}$(2)=3 $n_{rev}$(3)=2 $n_{rev}$(4)=0 and $n_{rev}$(5)=0 As for $m_0(i)$ which is the maximum number of symmetrical codes on each level, it is clear in the equation (4) and in FIG. 5 that;

$m_0$(1)=2 (0 and 1), $m_0$(2)=2 (00 and 11), $m_0$(3)=4 (000, 010, 101 and 111) and $m_0$(4)=4 (0000, 0110, 1001, and 1111).

When i=1, $n_{rev}$(1)=0, and m(1)=$m_0$(1)–0–0=2 (equation (3)), and therefore, the equation (2) is satisfied. In this case, no assignment of a code is carried out because $n_{rev}$(1)=0. This means that at level 1 in FIG. 4, there exists two symmetrical code spaces (0 and 1) of the bit length 1, but no symbol of the bit length 1 exists.

Next, when i=2, m(2)=2–0–0=2 (equation (3)), and $n_{rev}$(2)=3 are satisfied. This means that there exist three symbols of bit length 2 to be assigned, and there exist two symmetrical spaces on level 2. Therefore, two symbols having high occurrence probability are assigned so that 00 for "A", and 11 for "B". And, $n_{rev}$(3) (which is formerly 2) is updated to 3 by adding 1 which is the number of the non-assigned symbols on the level 2 (equation (6)).

Next, when i=3, m(3)=4–0–2=2 is satisfied. This means that although there are four symmetrical spaces (000, 010, 101 and 111) on level 3 in FIG.4, the codes 000 and 111 do not satisfy the prefix condition, since 000 includes 00 which is already assigned to "A", and 111 includes 11 which is already assigned to "B". So, the number of available symmetrical spaces on level 3 is 2 (010 and 101). The symbols "C" and "D" which have higher occurrence probability than that of "E" are assigned on this level to "010" and "101", respectively.

The similar process is repeated, and on level 4, the symbol "E" is assigned to 0110.

In comparing the equation (3) with FIG. 4, it should be appreciated that m(i) is the number of available symmetrical spaces on level i, $m_0(i)$ is the total number of symmetrical spaces on level i, the second term of the equation (3) is the number of unavailable symmetrical spaces because of lack of prefix condition due to occupation in the levels younger than [i/2], and the third term of the equation (3) is the number of unavailable symmetrical spaces because of lack of prefix condition due to occupation between levels [i/2]+1 and i–1.

Figure 3:
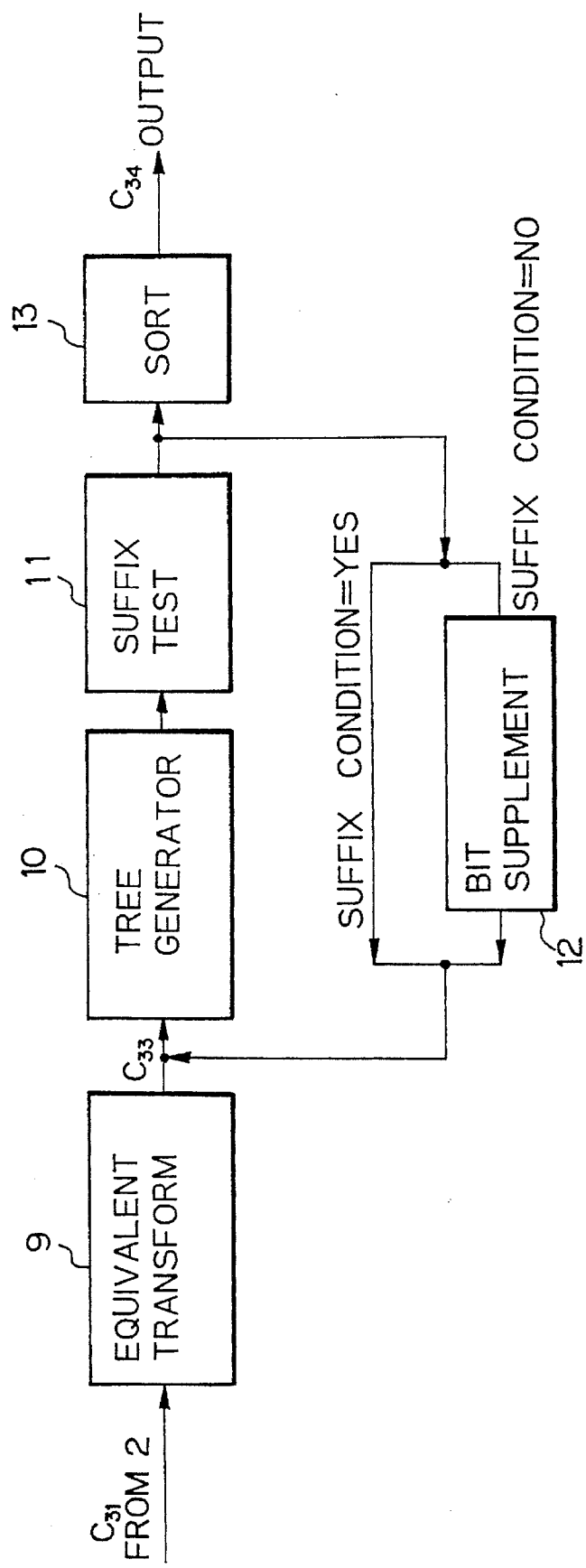
FIG. 3 is a block diagram of an asymmetrical reversible code generator 4 in FIG. 1.

FIG. 3 shows a block diagram of the asymmetrical reversible code generator 4 of FIG. 1. In FIG. 3, the numeral 9 is an equivalent transform, 10 is a reverse tree generator, 11 is a suffix test, 12 is a bit supplement, and 13 is a sort means.

The object of the asymmetrical reversible code generator in FIG. 3 is to convert a non-reversible code to an asymmetrical reversible code.

The example of the code for explanation is shown in the table 3.

The input non-reversible code is shown as $C_{31}$ in the table 3. The code $C_{31}$ is expressed on the symbol tree or the binary tree in FIG. 5A. It is supposed in FIG. 5A that a left down slope shows a code 0, and a right down slope shows a code 1. Therefore, the symbol "A" which has two left down slopes is represented by "00". The symbol "B" which has left down slope and right down slope is represented by "01". Similarly, the symbol "C" is "11", the symbol "D" is "100", and the symbol "E" is "101". The code $C_{31}$ in the table 3 is thus obtained.

It should be noted in the code $C_{31}$ that any short code (00, 01, and 11) does not coincide with a prefix portion of longer code (100, and 101). However, the symbol "00" of "A" coincides with the rear portion (suffix) of the symbol "D" ("100"), and the symbol "B" of "01" coincides with the rear portion of the symbol "E" ("101"). Therefore, the code $C_{31}$ does not satisfy the suffix condition, although it satisfies the prefix condition, and the code $C_{31}$ is not reversible, in other words, it can not be instantaneously decoded in backward direction, but it is decodable only in forward direction.

The first step for generating a reversible asymmetrical code is an equivalent transform step. The equivalent transform step exchanges nodes or leaves on the same level as each other on the symbol tree as shown in FIG. 5, so that an average code length does not change by the equivalent transform, and the number of infringement of suffix condition is reduced. In the example of FIG. 5, the symbol (or leaf) "C" and the node X are exchanged (FIG. 5A), and the result is shown in FIG. 5B. The code of FIG. 5B is shown as a provisional code $C_{33}$ in the table 3, and it should be noted that only one code "C" (10) infringes the suffix condition of "D" (110). It should be noted that the number of infringement of suffix condition is reduced from two to one, by the equivalent transform step.

The second step for generating a reversible asymmetrical code is to set up a reverse binary tree in the reverse tree generator 10 in FIG. 3. During the generation of the reverse tree, the suffix condition is tested in the suffix test 11. If a suffix condition is infringed, a supplement bit is added at the end of the code word in the bit supplement 12. This is explained in accordance with FIG. 6.

FIG. 6A shows the input to the reverse tree generator 10 or the output of the equivalent transform 9.

The set up of a reverse tree is carried out in the order of the bit length. As the bit length of A, B and C in the code $C_{33}$ is 2, and the bit length of D and E is 3, the first group A, B and C are set up first.

The reverse tree is generated in the manner that a leaf in a normal tree (FIG. 6A) is located on a root position, and a branch extends upwardly along the same branches as that of a normal tree or parallel to the branch in the normal tree. In case of symbol "A", a branch extends right and upwardly as shown in FIG. 6B. It should be appreciated that the branches in FIG. 6B are parallel to those between the leaf A and the root in FIG. 6A.

Similarly, the symbol "B" is set up in a reverse tree as shown in FIG. 6C, and the symbol "C" is set up as shown in FIG. 6D.

When we try to assign a code to the symbol "D", the suffix test 11 recognizes that the path to the symbol "D" overlaps partially with the complete path to the symbol "C". This means that the code of the symbol "C" infringes the suffix condition of the symbol D. When that case happens, the set up of the symbol D on the reverse tree is stopped temporarily, and other symbols having the same bit length are assigned. In this case, the symbol "E" is assigned as shown in FIG. 6E.

When all the symbols having the same bit length are set up, the symbol "D" which was not set up is processed by adding at least one supplement bit at the end of the code. The number of supplement bits should be as small as possible, as far as the suffix problem is solved. In the present case, the supplement bits "11" are added at the end of the symbol "D", and the new symbol D' is 11011, as shown in FIG. 6A. The symbol D' is set up on the reverse tree as shown in FIG. 6F. No suffix problem occurs in this case.

It should be noted that the addition of supplement bits does not break the prefix condition, as a supplement bit is attached at the end of a code.

The selection of supplement bits is carried out starting from one bit. First, a bit "0" is attached at the end of the code, and test if the suffix problem occurs or not. If the suffix problem still occurs, then, the supplement bit "1" is tried. When both "0" and "1" do not satisfy the suffix problem, then, two supplement bits are tried, and test whether each pattern "00", "01", "10" and "11" satisfy the suffix problem. In the embodiment, the pattern "11" solves the suffix condition, and the symbol of "D'" is finally determined to be 11011, and the symbol "D" is temporarily assigned to 11011.

When all the symbols of three bits length are assigned on a reverse tree, a longer code is to be assigned. In the embodiment, as no longer code exists, the second step for assigning symbols on a reverse tree finishes.

The third step for generating the reversible asymmetrical code is to sort the codes of FIG. 6F in the sort 13 so that the shorter code is assigned to the symbol having the higher occurrence probability. In the example, the occurrence probability of the symbol "D" is 0.10, and the symbol "E" is 0.09, while the code length of D is 5, and the code length of "E" is 3. Therefore, the codes of D and E are exchanged. Finally, the reverse tree is located in a normal manner as shown in FIG. 6G, and the final reversible code $C_{34}$ in the table 3 is obtained.

As mentioned above, the present invention provides symmetrical reversible code and/or asymmetrical reversible code. By considering occurrence probability of each symbol, the present code has shorter average code length than those of prior code. The tables 1, and 2 show the effect of the present codes ($C_{14}$ and $C_{24}$ in the table 1, and $C_{15}$ and $C_{25}$ in the table 2) together with the prior reversible codes for comparison purposes. It should be noted that the present codes have the shorter average code length than those of prior reversible code. The present symmetrical code has the feature that a single code table is enough for decoding in forward direction and in backward direction and therefore memory space in decoding side is saved and structure of decoding circuit is simplified, and the present asymmetrical code has that feature that the average bit length is shorter than that of the symmetrical code and therefore the higher transmission efficiency is obtained.

From the foregoing, it will now be apparent that new and improved reversible variable length codes are generated. It should be understood of course that the embodiments disclosed are merely illustrative and are not intended to limit the scope of the invention. Reference should be made to the appended claims, therefore, for indicating the scope of the invention rather than the specification.

What is claimed is:

1. A reversible instantaneously decodable variable length code generation system comprising;

means for providing symbols with occurrence probability of each symbol, first encoding means for provisionally encoding said symbols to non-reversible variable length code according to occurrence probability of each symbol, second encoding means for transforming said non-reversible code to asymmetrical reversible code, third encoding means for transforming said non-reversible code to symmetrical reversible code, and selection means for selecting at least one output of said second encoding means and said third encoding means to provide an instantaneously decodable reversible variable length code.

2. A reversible instantaneously decodable variable length code generation system according to claim 1, wherein said second encoding means comprises;

equivalent transform means for exchanging leaves or nodes on a symbol tree on the same level as each other so that number of infringement of suffix condition is reduced, reverse tree-generator means coupled with output of said equivalent transform means to assign each symbol on a reverse symbol tree, a suffix test means coupled with said reverse tree generator means to test if a symbol assigned in said reverse tree generator means satisfies a suffix condition, a bit supplement means for supplement at least one bit at end of a code assigned in said reverse tree generator means when said suffix condition is infringed, sorting means coupled with output of said suffix test means to sort the thus generated codes so that a short code is assigned to a symbol of higher occurrence probability, to provide a resultant asymmetrical variable length code.

3. A reversible instantaneously decodable variable length code generation system according to claim 1, wherein said third encoding means comprises;

a bit length vector test means for providing number of symbols to be assigned for each bit length, a code word assigner for assigning a symmetrical code to each symbol on each level of a symbol tree, when available number of symmetrical code spaces satisfying prefix condition on the level of the symbol tree is larger than number of symbols to be assigned having bit length equal to said level, a bit length vector modification means for incrementing bit length of a symbol when said available number of symmetrical code spaces is less than number of symbols to be assigned on the level of the bit length, supplied by said bit length vector test means, and means for repeating above steps after updating the bit length vector in said bit length vector test means.

4. A reversible instantaneously decodable variable length code generation system comprising;

means for providing symbols with occurrence probability of each symbol, first encoding means for provisionally encoding said symbols to non-reversible variable length code according to occurrence probability of each symbol, second encoding means for transforming said non-reversible code to asymmetrical reversible code, said second encoding means comprising;

equivalent transform means for exchanging leaves or nodes on a symbol tree on the same level as each other so that number of infringement of suffix condition is reduced, reverse tree generator means coupled with output of said equivalent transform means to assign each symbol on a reverse symbol tree, a suffix test means coupled with said reverse tree generator means to test if a symbol assigned in said reverse tree generator means satisfies a suffix condition, a bit supplement means for supplement at least one bit at end of a code assigned in said reverse tree generator means when said suffix condition is infringed, sorting means coupled with output of said suffix test means to sort the thus generated codes so that a short code is assigned to a symbol of higher occurrence probability, to provide a resultant asymmetrical variable length code.

5. A reversible instantaneously decodable variable length code generation system comprising;

means for providing symbols with occurrence probability of each symbol, first encoding means for provisionally encoding said symbols to non-reversible variable length code according to occurrence probability of each symbol, second encoding means for transforming said non-reversible code to symmetrical reversible code, and said second encoding means comprising;

a bit length vector test means for providing number of symbols to be assigned for each bit length, a code word assigner for assigning a symmetrical code to each symbol on each level of a symbol tree, when available number of symmetrical code spaces satisfying prefix condition on the level of the symbol tree is larger than number of symbols to be assigned having bit length equal to said level, a bit length vector modification means for incrementing bit length of a symbol when said available number of symmetrical code spaces is less than number of symbols to be assigned on the level of the bit length, supplied by said bit length vector test means, and means for repeating above steps after updating the bit length vector in said bit length vector test means.

* * * * *